United States Patent
Moraes et al.

(10) Patent No.: US 6,300,564 B1
(45) Date of Patent: Oct. 9, 2001

(54) MOUNTING OF CAPACITORS IN ELECTRICAL CONTROL BOX

(75) Inventors: Luciano da Luz Moraes, Canoas; Juan Carlos Carne Correa, Porto Alegre; Daniel Alessandro Oliveira de Barros, Novo Hamburgo, all of (BR)

(73) Assignee: Carrier Corporation, Syracuse, NY (US)

( * ) Notice: Subject to any disclaimer, the term of this patent is extended or adjusted under 35 U.S.C. 154(b) by 0 days.

(21) Appl. No.: 09/554,054
(22) PCT Filed: Sep. 16, 1998
(86) PCT No.: PCT/BR98/00075
§ 371 Date: May 9, 2000
§ 102(e) Date: May 9, 2000
(87) PCT Pub. No.: WO00/16351
PCT Pub. Date: Mar. 23, 2000

(51) Int. Cl.[7] .................... H02G 3/08; H05K 5/00
(52) U.S. Cl. ..................... 174/52.1; 361/809; 361/811
(58) Field of Search .......................... 174/52.1; 361/807, 361/808, 809, 810, 811, 812, 782, 830

(56) References Cited

U.S. PATENT DOCUMENTS

| | | | |
|---|---|---|---|
| 3,943,412 | * | 3/1976 | Wickstrom ........................ 361/600 |
| 4,153,310 | * | 5/1979 | Loving et al. .................... 312/100 |
| 5,049,703 | * | 9/1991 | Simon ............................... 174/52.1 |
| 5,532,435 | | 7/1996 | Bolton et al. ..................... 174/135 |
| 6,163,460 | * | 12/2000 | Baur et al. ........................ 361/752 |

FOREIGN PATENT DOCUMENTS

| | | | |
|---|---|---|---|
| 57016546 | 1/1982 | (JP) | ............... H02K/5/22 |
| 57020138 | 2/1982 | (JP) | ............... H02K/5/22 |
| 05234802 | 9/1993 | (JP) | ............... H01G/1/03 |

* cited by examiner

*Primary Examiner*—Dean A. Reichard
*Assistant Examiner*—Hung V Ngo

(57) ABSTRACT

Apparatus for alternatively mounting either a large cylindrical capacitor having a given length and a given diameter or a small cylindrical capacitor having a given length and a given diameter. The apparatus includes a substantially planar support wall having two or more substantially U-shaped support walls extending substantially perpendicularly therefrom. The U-shaped support walls are parallel to one another and are spaced from one another by a distance such that at least two of the U-shaped walls will span the given length of either of the capacitors. Each of the two or more U-shaped walls defines an upwardly facing capacitor support surface. Each of the support surfaces has a lower arcuate section extending between left and right end points. The lower arcuate sections have an effective diameter, which is substantially equal to the given diameter of the small capacitor. Each of the support surfaces has two upper arcuate support sections, one of each of the upper sections extends from each of the left and right end points of the lower arcuate support section. Each of the upper arcuate sections has an effective diameter substantially equal to the diameter of the large capacitor.

3 Claims, 5 Drawing Sheets

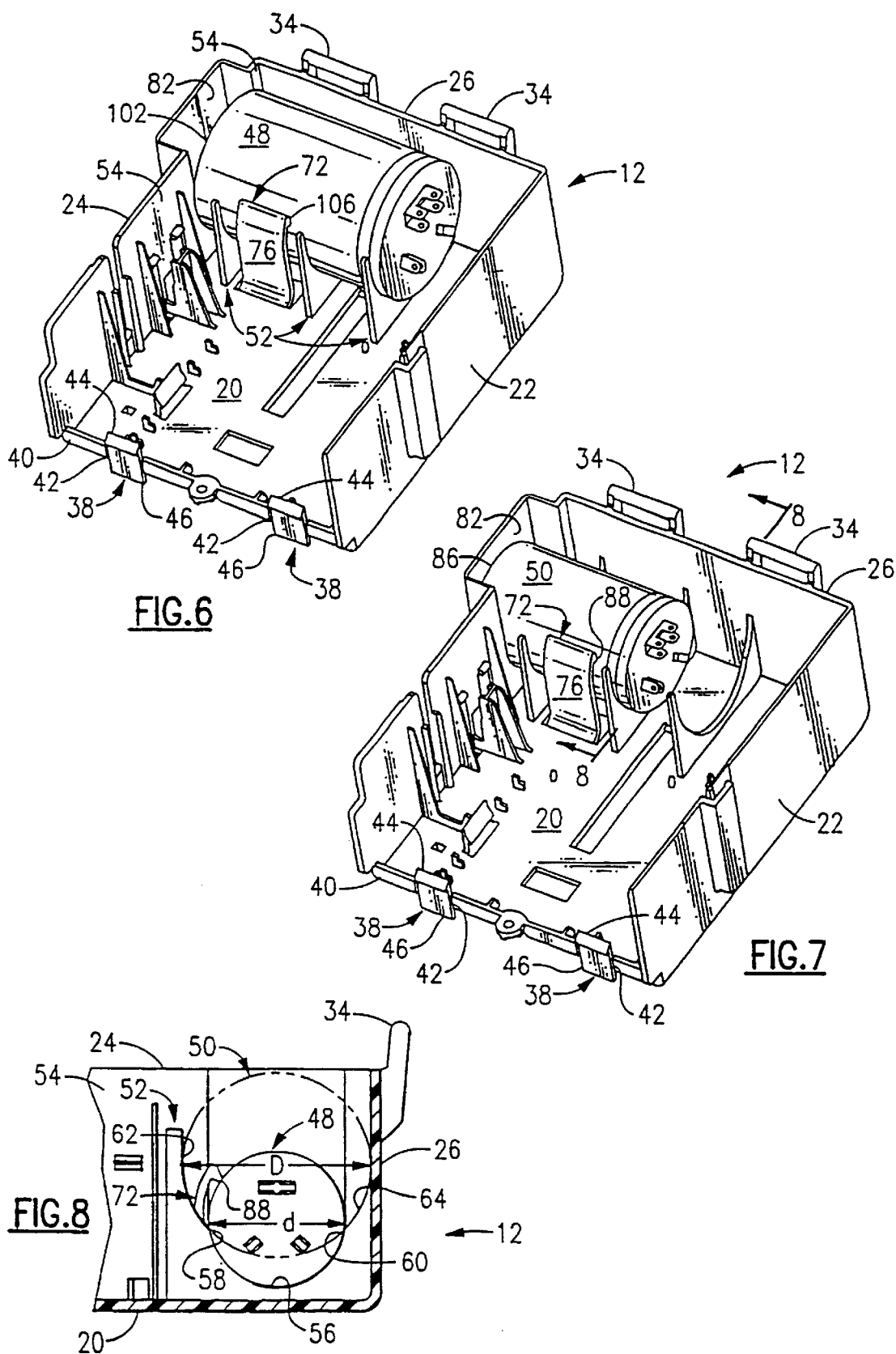

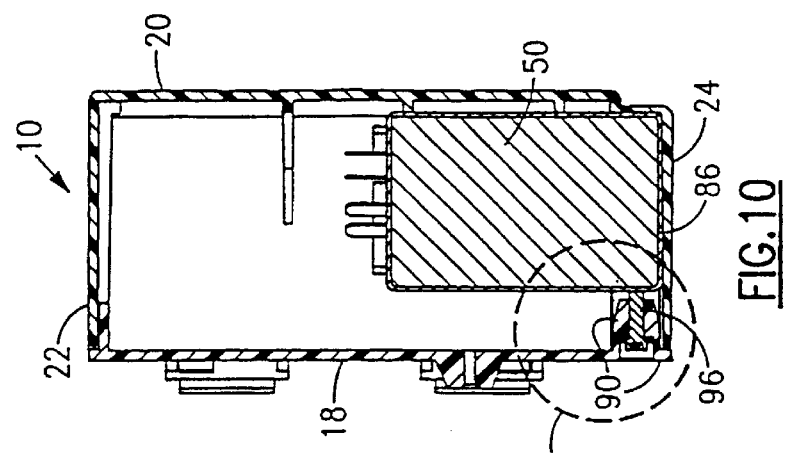
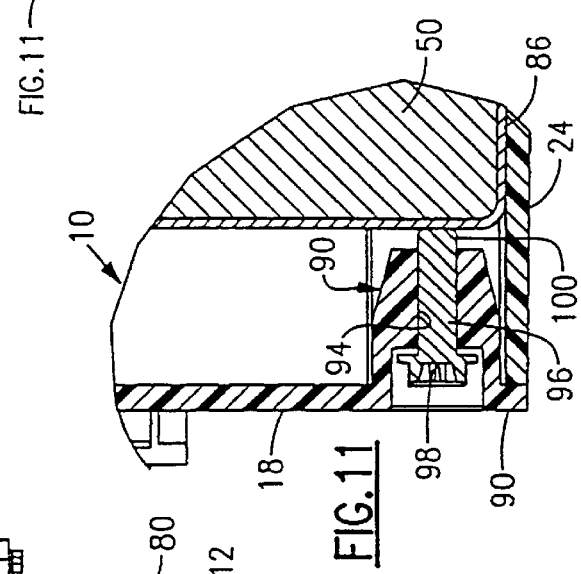
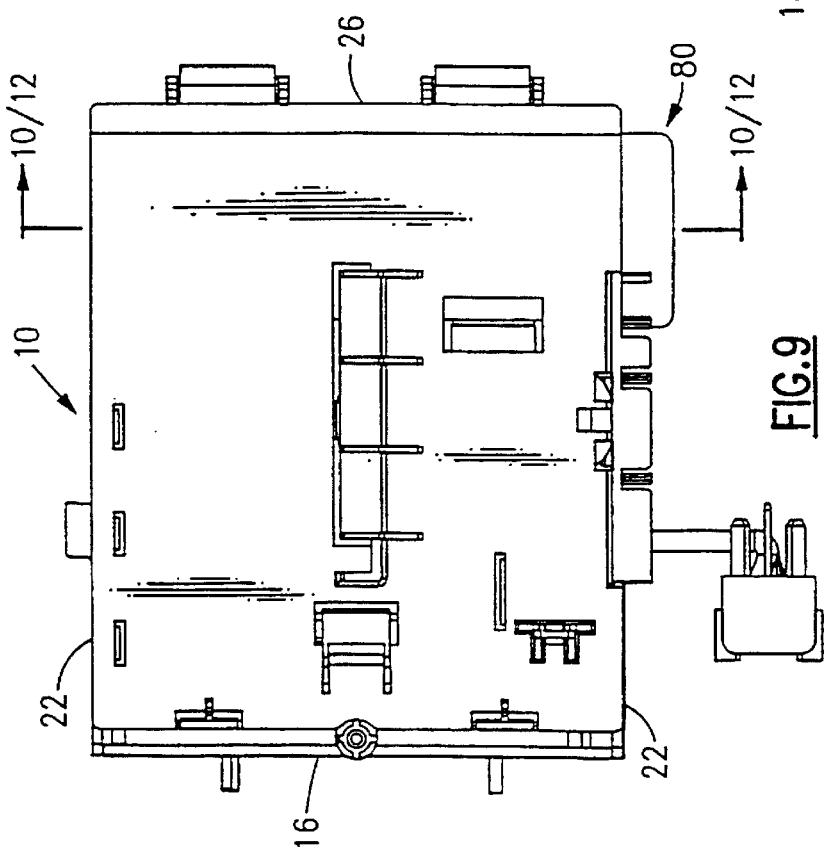

MOUNTING OF CAPACITORS IN ELECTRICAL CONTROL BOX

TECHNICAL FIELD

This invention relates to control boxes for electrical appliances and, more specifically, to internal structure within the control box which allows the mounting different sized capacitors therein.

BACKGROUND ART

Most electrical appliances are provided with self-contained electrical control boxes. Such control boxes typically include control switches such as on/off switches, function switches, thermostats, etc. Power cords for such appliances usually pass into the control box where internal electrical wiring receives and distributes electrical power to various power utilizing components of the appliance. Some appliances, such as room air conditioner units, have more than one electric motor associated therewith, specifically a fan motor and a compressor motor. Such motors typically require capacitors, for starting and/or during normal running operation. Metal clad electrolytic capacitors are available, which may serve more than one motor.

Since such capacitors are intimately involved in the electrical wiring of the control components, it is desirable to mount such capacitors within the control box and, accordingly, the necessary fasteners and ground structure are provided in the control box to properly secure such capacitors. It is also common practice to utilize a common control box for different appliances having different electrical requirement and, accordingly, requiring capacitors of varying sizes. Accordingly, it is deemed desirable to provide for a molded plastic control box having an integrally molded capability for mounting capacitors of different sizes and for providing external ground connections through the control box to such capacitors.

DISCLOSURE OF THE INVENTION

Apparatus for alternatively mounting either a large cylindrical capacitor having a given length and a given diameter or a small cylindrical capacitor having a given length and a given diameter. The apparatus includes a substantially planar support wall having two or more substantially U-shaped support walls extending substantially perpendicularly therefrom. The U-shaped support walls are parallel to one another and are spaced from one another by a distance such that at least two of the U-shaped walls will span the given length of either of the capacitors. Each of the two or more U-shaped walls defines an upwardly facing capacitor support surface. Each of the support surfaces has a lower arcuate section extending between left and right end points. The lower arcuate sections have an effective diameter, which is substantially equal to the given diameter of the small capacitor. Each of the support surfaces has two upper arcuate support sections, one of each of the upper sections extends from each of the left and right end points of the lower arcuate support section. Each of the upper arcuate sections has an effective diameter substantially equal to the diameter of the large capacitor.

BRIEF DESCRIPTION OF THE DRAWINGS

The invention may be better understood and its objects and advantages will become apparent to those skilled in the art by reference to the accompanying drawings, in which:

FIG. 6 is a view similar to FIG. 4 showing a large capacitor mounted within the control box;

FIG. 7 is a view similar to FIG. 6 showing a small capacitor mounted within the control box;

FIG. 8 is a sectional view taken along the line 8—8 of FIG. 7;

FIG. 9 is a right-side view of the control box illustrated in FIG. 1;

FIG. 10 is a sectional view taken along the lines 10–12 of FIG. 9 with a small capacitor installed therein;

FIG. 11 is an enlarged view showing the details of the region identified as FIG. 11 in FIG. 10;

BEST MODE FOR CARRYING OUT THE INVENTION AND INDUSTRIAL APPLICABILITY

Figure 1:
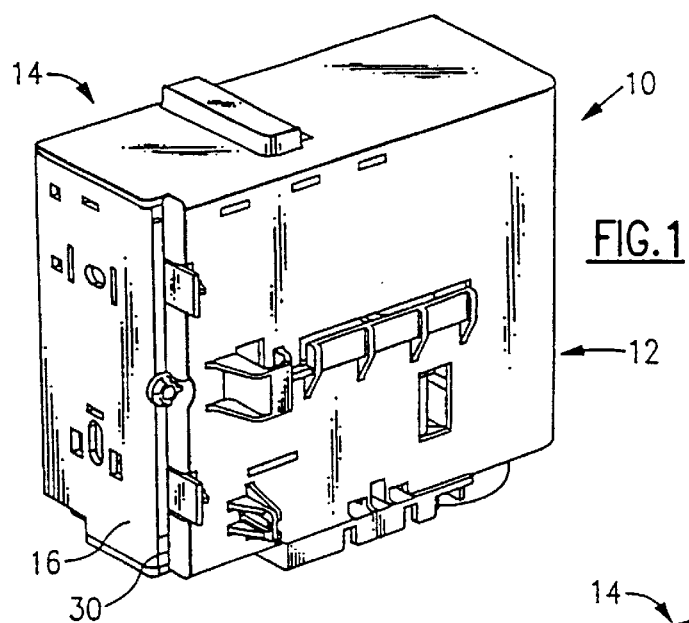
FIG. 1 is a perspective view taken from the right front side of a control box incorporating the present invention.
Figure 2:
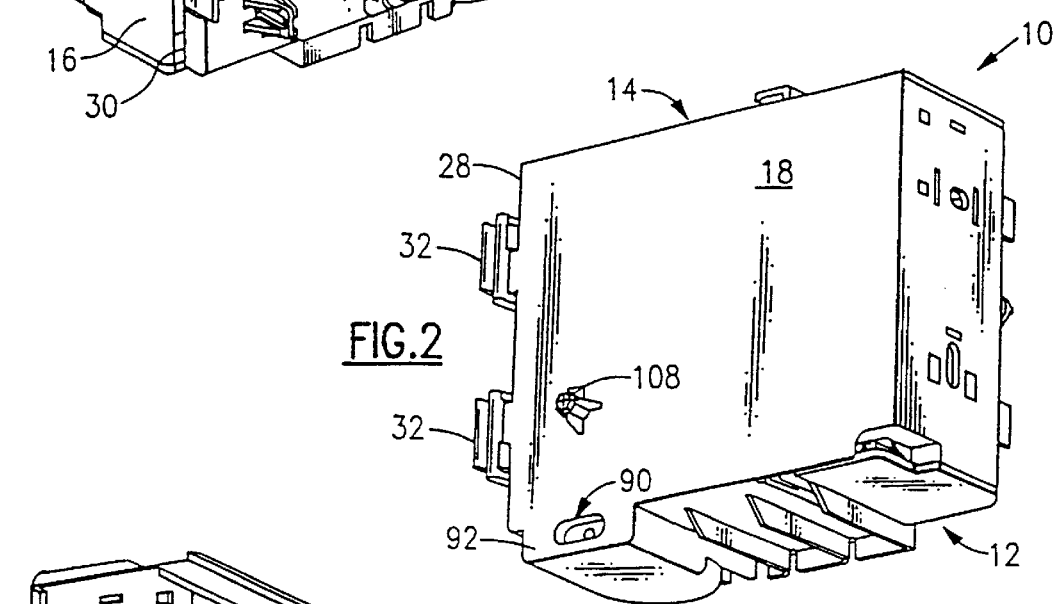
FIG. 2 is a perspective view of the control box of FIG. 1 from the left lower side thereof.
Figure 3:
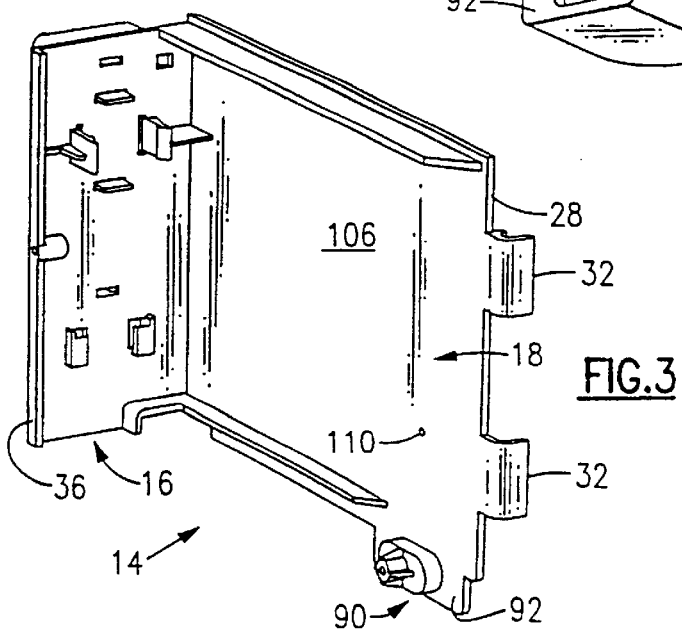
FIG. 3 is a perspective view taken from the back side of the interior of the cover of the control box of FIG. 1.
Figure 4:
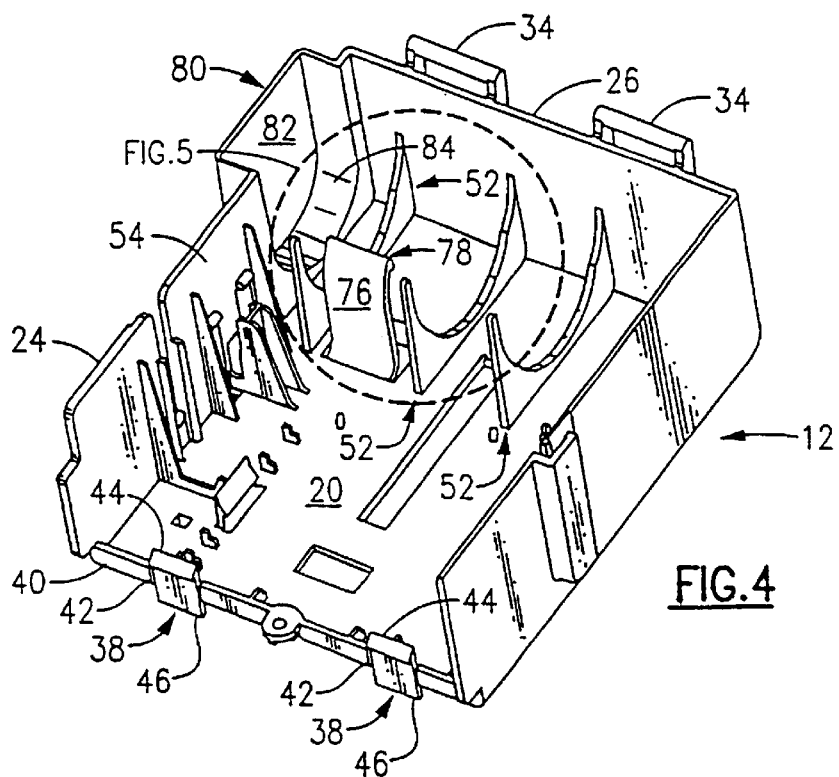
FIG. 4 is an enlarged perspective view of the interior of the main body of the control box of FIG. 1

FIGS. 1 and 2 illustrate an electrical control box 10, which includes a main body section 12 and a cover 14. Both the body and the cover are single piece components molded from a suitable structural plastic material such as polystyrene or the like. The control box 10 is a substantially rectangular shaped structure with the cover section 14, as best seen in FIG. 3, defining the front wall 16 and the left side wall 18 thereof. It should be understood that the terms left and right, front and back, and top and bottom are used with reference to the control box as illustrated in FIG. 1. The main body 12 thus defines the right side wall 20, the top 22, the bottom 24 and the back wall 26. The main body 12 and the cover 14 are attached to one another by a hinged connection at the left rear corner 28 thereof and a releasable latching connection at the right front corner 30 thereof. The hinge connection 28 includes two hook-shaped outwardly extending hinges 32 formed at the back of the left side wall 18 of the cover 14, and a pair of hinge pins 34 configured to receive the hinges formed on the left side of the back wall 26 of the main body 12. The latching interconnection 30 includes an inwardly extending lip 36 formed on the right side of the front wall 16 of the cover 14, and two flexible latches 38 formed at the front edge 40 of the right side wall 20 of the main body 12. As best seen in FIG. 4, the latches 38 each comprise a rectangular flex section 42, which is fixed to the front edge 40 at approximately the midpoint thereof. The flex sections carry at the left-hand end thereof a triangular latch head 44 adapted to flex rearwardly to move into engagement with the lip 36 on the cover 14 and to be flexed out of engagement with the lip by forward motion of a free-standing right-hand end 46 of the flex section 42.

Looking now at FIGS. 4–13, the interior of the main body 12 adjacent the back wall 26 is configured to support, using substantially the same structure, a large cylindrical capacitor 48 or, alternatively, a small cylindrical capacitor 50. The capacitor support structure includes three identical U-shaped support walls 52. The walls 52 are parallel to one another and are unequally spaced from one another by a distance to accommodate the different lengths of the different sized capacitors. The walls 52 will be referred to as the "first wall", which is spaced from the interior side 54 of the bottom wall 24, a "second wall" longitudinally spaced from the first wall and a "third wall", in turn, longitudinally spaced from the second wall. Each of the walls 52 defines a substantially upwardly facing capacitor support surface which is configured to have different arcuate regions thereon for the different sized capacitors.

Figure 5:
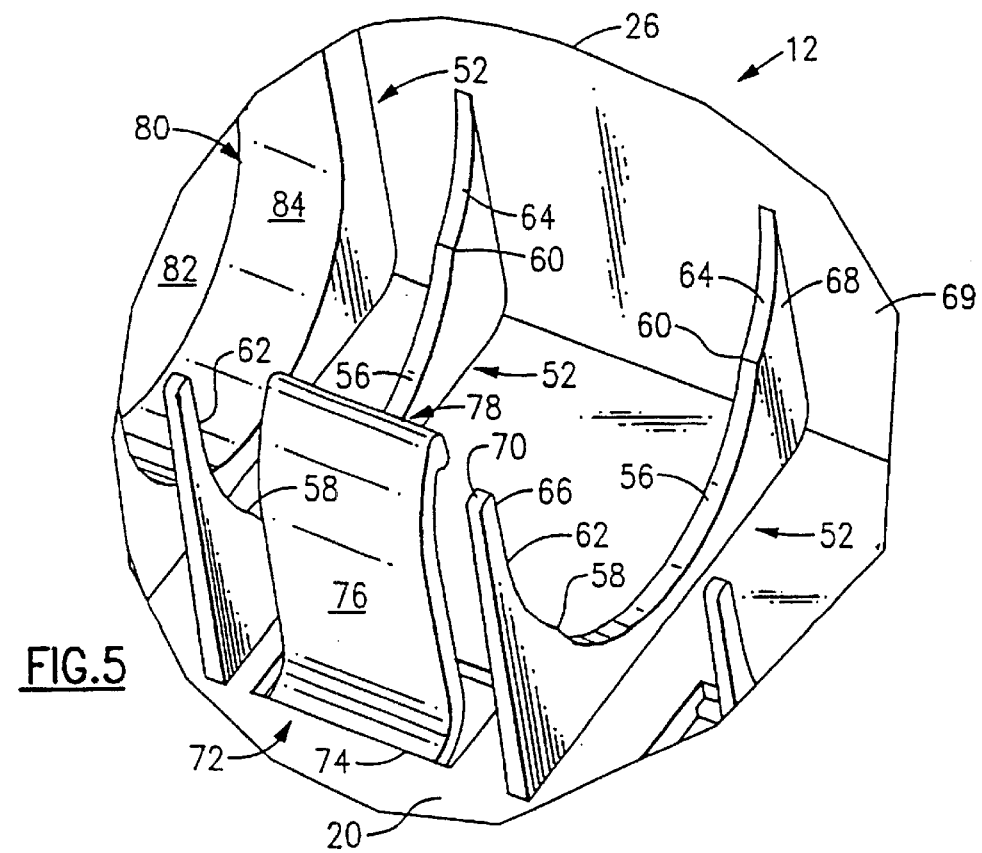
FIG. 5 is an enlarged view of the detail identified as FIG. 5 in FIG. 4.

As best seen in FIGS. 5 and 8. a lower region 56 of the arcuate support surface, which extends from points identified by reference numeral 58 on the left side to reference numeral 60 on the right side, has an effective diameter substantially equal to the diameter "d" of the small capacitor 50. Extending from the ends 58 and 60 of the support region 56 on the left and right-hand sides of the walls 52 are left and right arcuate support regions 62 and 64, each of which has an effective diameter substantially equivalent the diameter "D" of the large capacitor 48. Each of the U-shaped walls 52 further includes a vertically extending section 66 and 68 on the left and right-hand sides thereof. The section 66 extends to a top end 70 while the right-hand section 68 blends into the interior surface 69 of the back wall 26. The vertical surfaces 66 and 68 are spaced from one another by a distance substantially equal to the diameter "D" of the large cylindrical capacitor.

As best seen in FIGS. 4 and 5, located between the first and second U-shaped walls 52 is a vertically extending flexible latch 72, which has a fixed end 74 thereof integrally formed with the right side wall 20, an elongated vertically extending section 76, and a substantially triangularly shaped capacitor engaging head 78 at the other end thereof. The upper end of the vertical section 76 is configured to curve inwardly toward the rear wall 26 when the latch is in an undeformed condition, as illustrated in FIG. 5.

As best seen in FIGS. 4 and 5, the bottom wall 24 has a U-shaped extension 80 formed therein, which includes a planar end wall 82 and an arcuate support surface 84 having an effective diameter substantially equal to the diameter "d" of the small capacitor 50. The arcuate support surface 84 of the extension 80 is in axial alignment with the lower arcuate support surfaces 56 on the U-shaped walls 52.

Installation of a small diameter capacitor 50 is simply accomplished by placing the base 86 of the capacitor 50 into the U-shaped extension 80 and lowering the capacitor downwardly until it moves into supporting confronting contact with the arcuate support surface 84 of the U-shaped extension and the lower arcuate support surfaces 56 of the first and second U-shaped walls 52. As the capacitor 50 is pushed downwardly into such engagement, the outer surface of the capacitor will engage the head 78 of the latch 72 thereby displacing the latch outwardly until the capacitor moves to the installed position, as illustrated in FIGS. 7 and 8. With the capacitor thus installed, the latch head moves inwardly into engagement with the outer surface of the capacitor at a position 88 above the midpoint of the capacitor to thereby impart a force extending to the right and downwardly thereupon which serves to retain the capacitor in its installed position.

FIGS. 10 and 11 illustrate a cross-section of the small capacitor 50 installed, as described above, with the cover 14 installed to the main body 12 and a grounding screw 96 in conductive contact with the capacitor 50. As is best seen in FIGS. 2, 3, 10 and 11, a ground screw support extension 90 is molded into an extension 92 in a lower end of the left side wall 18. The wall extension 90 is adapted to overly the upper end of the U-shaped extension 80, which receives the lower end of the small capacitor and, accordingly, the ground extension is in overlying relationship with the end of the capacitor as seen in FIGS. 10 and 11. An opening 94 provided in the ground extension 90 allows for a ground screw to be threadably received therein. Accordingly, appropriate ground wires are attached under the head 98 of the ground screw 96 and the screw is then appropriately tightened to secure the ground leads (not shown) thereby causing the inner end 100 of the screw 96 to establish a ground connection with the outer surface of the small capacitor 50.

FIGS. 6, 8, 12 and 13 illustrate a large diameter capacitor 48 engaged with the support structure. Installation of the large capacitor 48 is accomplished by placing the end 102 of the capacitor in contact with the interior surface 54 of the bottom 24 and displacing the capacitor downwardly until the outer surface thereof is in contact with the large diameter support surfaces 62 and 64 of all three of the U-shaped walls 52. As the large capacitor moves downward, the outer surface thereof engages the head 78 of the latch 72 and thereby displaces it to the left by a distance substantially greater than it is displaced during installation of the small capacitor 50. The length of the vertical section 76 of the latch 72 is sufficient that such flexing can readily occur without overstressing the latch. Following movement of the large capacitor 48 into supporting contact with the surfaces 62 and 64, the latch head 78 will engage the outer surface of the large capacitor at a location 106 which is above the midpoint of the capacitor such that the head 78 will impart a force on the side of the capacitor to the right and downwardly, as viewed in FIG. 8 to hold the capacitor in its installed position.

Figure 12:
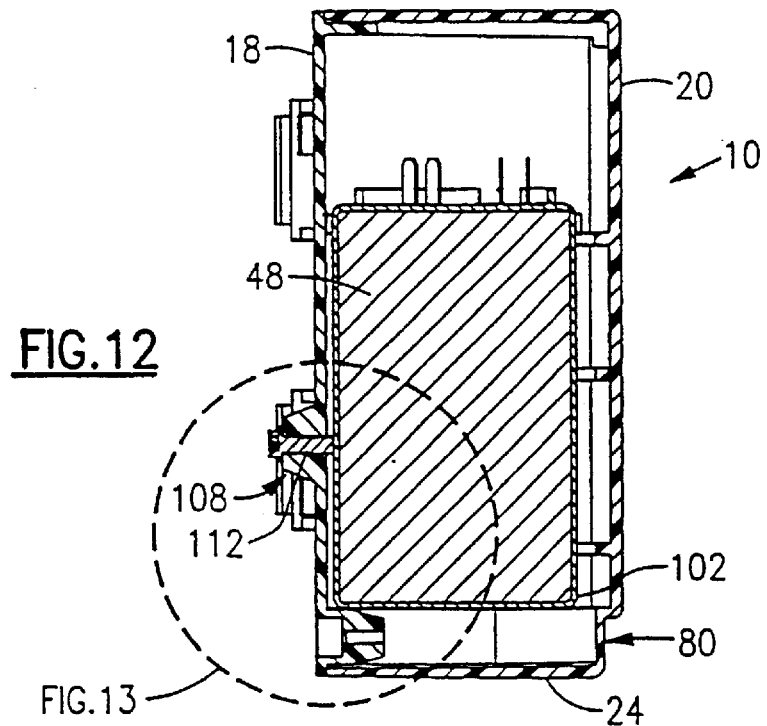
FIG. 12 is a sectional view taken along the lines 10–12 of FIG. 9 showing a large capacitor installed therein.
Figure 13:
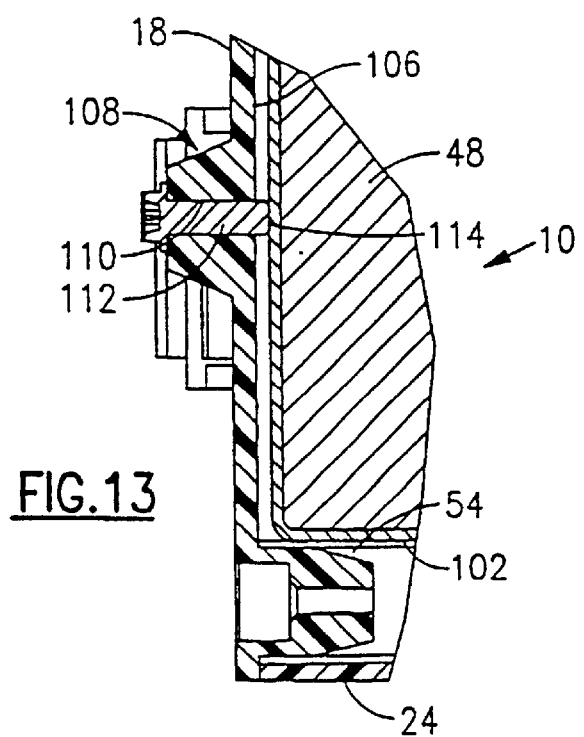
FIG. 13 is an enlarged view showing the details identified as FIG. 13 in FIG. 12.

Grounding of the large capacitor is illustrated in FIGS. 12 and 13. Because of the larger size of the capacitor, the outer surface is in close proximity to the inside surface 106 of the left side wall 18 when the cover is installed. Accordingly, a grounding extension 108 for the large capacitor extends outwardly from the side wall 18 with a through opening 110 adapted to receive a grounding screw 112 therethrough in a manner identical to that in connection with the grounding of the small capacitor. Accordingly, with ground wires appropriately attached to the ground screw 112, the end 114 will be in contact with the outer surface of the large capacitor 48 when the control box is assembled to the main body 12.

What is claimed is:

1. Apparatus for alternatively mounting either a large cylindrical capacitor having a given length and a given diameter or a small cylindrical capacitor having a given length and a given diameter, each of said capacitors having a longitudinal axis, comprising:

a substantially planar support wall;

two or more substantially U-shaped support walls extending substantially perpendicularly from said support wall, said U-shaped support walls being parallel to one another and being spaced from one another by a distance such that at least two of said U-shaped walls will span said given length of either of said capacitors when either of said capacitors is positioned with its said longitudinal axis extending perpendicular to said U-shaped support walls, each of said two or more U-shaped support walls defining an upwardly facing support surface;

each of said support surfaces having a lower arcuate section extending between left and right end points thereof, said lower arcuate sections having an effective diameter substantially equal to said given diameter of said small capacitor;

each of said support surfaces having two upper arcuate support sections, one of each of said upper arcuate support sections extending from said left and right end points of said lower arcuate section, and, each of said upper sections having an effective diameter substantially equal to said given diameter of said large capacitor;

whereby when a small capacitor is placed in contact with said U-shaped support walls, it is supported by at least two of said lower arcuate sections, and when a large capacitor is placed in contact with two or more of said U-shaped support walls, it is supported by said upper arcuate support sections of each of said U-shaped walls.

2. The apparatus of claim 1 wherein one side of each of said U-shaped walls has a section extending vertically upwardly from said upper arcuate support section to an elevation at least as high as the midpoint of both of said large and small capacitors when said capacitors are supported in their respective support sections;

a flexible element extending vertically from said first wall at a location between two of said U-shaped walls and adjacent the other side of said U-shaped walls from said vertically extending sections, said flexible element having a first end integrally formed with said first wall and a free standing elongated section extending vertically to an elevation above the midpoint of either said large or small capacitors when said capacitors are supported by their respective arcuate support surfaces, said flexible element having a capacitor engaging conformation at the other end thereof; and said elongated section further being configured to have an undeformed position, with its said capacitor engaging conformation lying within the confines of said U-shaped walls, and being capable of being displaced to a deflected position with said conformation engaging one of said capacitors and exerting a lateral force on said capacitor when said capacitor is engaged with its respective arcuate support surfaces and urging the other side of said capacitor into engagement with said vertically extending section on said one side of said U-shaped walls.

3. The apparatus of claim 2 further including a second support wall extending upwardly from said planar support wall, and in substantially perpendicular relation thereto, said second wall being in axially spaced parallel relationship with said two or more substantially U-shaped walls;

said second wall defining an arcuately shaped support surface therein having an effective diameter substantially equal to said given diameter of said small capacitor and located in spaced axial relationship with said lower support surfaces of said U-shaped support walls;

said second wall further having a planar end wall closing one end of said arcuate support surface to thereby define an arcuate space therebetween;

said arcuate space being adapted to receive an end of said smaller capacitor therein.

* * * * *